United States Patent [19]

Beane et al.

[11] Patent Number: 5,453,293

[45] Date of Patent: Sep. 26, 1995

[54] METHODS OF MANUFACTURING COATED PARTICLES HAVING DESIRED VALUES OF INTRINSIC PROPERTIES AND METHODS OF APPLYING THE COATED PARTICLES TO OBJECTS

[76] Inventors: Alan F. Beane, 34 Vincent Dr., Gilford, N.H. 03246; Glenn L. Beane, Perch Pond Rd., RFD3, Plymouth, N.H. 03264

[21] Appl. No.: 339,577

[22] Filed: Nov. 14, 1994

Related U.S. Application Data

[63] Continuation of Ser. No. 102,532, Aug. 4, 1993, abandoned, which is a continuation of Ser. No. 731,809, Jul. 17, 1991, abandoned.

[51] Int. Cl.$^6$ ............................. B05D 5/12; B05D 5/00
[52] U.S. Cl. ........................... 427/96; 427/214; 427/215; 427/216; 427/217; 205/109
[58] Field of Search ............................. 427/96, 214, 215, 427/216, 217; 205/109, 125, 920; 428/403, 570; 252/512, 513, 514

[56] References Cited

U.S. PATENT DOCUMENTS

| | | | |
|---|---|---|---|
| Re. 32,942 | 6/1989 | Butt | 428/551 |
| 3,061,525 | 10/1962 | Grazen | 205/109 |
| 3,488,263 | 1/1970 | Schmidt | 205/109 |
| 3,522,087 | 7/1970 | Lacal | 205/109 |
| 3,741,882 | 6/1973 | Schaer | 205/109 |
| 3,762,882 | 10/1973 | Grutza | 205/109 |
| 3,914,507 | 10/1975 | Fustukian | 427/217 |
| 4,010,005 | 3/1977 | Morisaki et al. | 205/109 |
| 4,063,907 | 12/1977 | Lee et al. | 427/215 |
| 4,158,719 | 6/1979 | Frantz | 428/567 |
| 4,305,792 | 12/1987 | Kedward et al. | 205/109 |
| 4,436,560 | 3/1984 | Fujita et al. | 205/109 |
| 4,441,965 | 4/1984 | Matsumura et al. | 205/109 |
| 4,505,720 | 3/1985 | Gabor et al. | 427/217 |
| 4,711,814 | 12/1987 | Teichmann | 427/217 |
| 4,732,702 | 3/1988 | Yamazaki et al. | 252/512 |

(List continued on next page.)

FOREIGN PATENT DOCUMENTS

| | | | |
|---|---|---|---|
| 2124637 | 12/1971 | Germany | 427/217 |
| 52-25375 | 7/1977 | Japan | 205/109 |
| 59-150098 | 8/1984 | Japan | 205/109 |
| 59-226199 | 12/1984 | Japan | 205/109 |
| 60-238500 | 11/1985 | Japan | 205/109 |
| 598181 | 2/1948 | United Kingdom | 427/217 |
| 1070343 | 6/1967 | United Kingdom | 205/109 |

OTHER PUBLICATIONS

Carpenter Technology Corporation, "Kovar® Alloy" brochure, date of publication unknown.
Jim Henry, Electroless (Autocatalytic, Chemical) Plating, pp. 361–364, 370–374 (undated).
L. M. Weisenberger, Copper Plating, pp. 159–169, 240 (undated).
GE Micron Powders, "General Electric Superabrasives for Grinding, Lapping and Polishing", 6 pages (undated).
Nathan Feldstein, "Composite Electroless Plating", Ch. 11, pp. 269–287, 1990, from Electroless Plating Fundamentals & Applications edited by Glenn O. Mallory & Juan B. Hajdu (date unknown).
Bindra & White, "Fundamental Aspect of Electroless Copper Plating", Ch. 12, pp. 289–329, 1990, from Electroless Plating Fundamentals & Applications edited by Glenn O. Mallory & Juan B. Hajdu (date unknown).

*Primary Examiner*—Terry J. Owens
*Attorney, Agent, or Firm*—Fish & Richardson

[57] ABSTRACT

Particles including a first material and having a first value of an intrinsic property such as thermal conductivity or coefficient of thermal expansion are coated, by a method such as electroless plating, electrolytic plating, sputtering, or spraying, with a second material having a second value of the intrinsic property in approximately the ratio of volume of coating to volume of each of the particles which makes the value of the intrinsic property of each of the coated particles equal to a desired value. The first and second materials can be metal or non-metal. A plurality of particles, including the coated particles, can be consolidated to form an article, or the particles and a matrix material can be co-deposited on a surface as a coating by a method such as electrolytic plating.

31 Claims, 3 Drawing Sheets

U.S. PATENT DOCUMENTS

| | | | |
|---|---|---|---|
| 4,742,861 | 5/1988 | Shoher et al. | 164/80 |
| 4,746,412 | 5/1988 | Uchida et al. | 205/109 |
| 4,830,889 | 5/1989 | Henry et al. | 427/438 |
| 4,846,940 | 7/1989 | Neuhäuser | 205/109 |
| 4,857,233 | 8/1989 | Teichmann et al. | 252/513 |
| 4,975,160 | 12/1990 | Ostwald et al. | 205/109 |
| 4,997,686 | 3/1991 | Feldstein et al. | 427/443.1 |
| 5,001,546 | 3/1991 | Butt | 357/71 |
| 5,014,159 | 5/1991 | Butt | 361/389 |
| 5,015,803 | 5/1991 | Mahulikar et al. | 174/52.4 |
| 5,043,534 | 8/1991 | Mahulikar et al. | 174/52.4 |
| 5,062,865 | 11/1991 | Chen et al. | 427/217 |
| 5,077,637 | 12/1991 | Martorana et al. | 174/252 |
| 5,122,930 | 6/1992 | Kondo et al. | 361/386 |
| 5,152,931 | 10/1992 | Alexander | 252/512 |
| 5,152,959 | 10/1992 | Scorey | 419/22 |
| 5,164,884 | 11/1992 | Pesola | 361/386 |
| 5,165,986 | 11/1992 | Gardner et al. | 361/397 |
| 5,168,344 | 12/1992 | Ehlert et al. | 257/693 |
| 5,171,419 | 12/1992 | Wheeler et al. | 205/176 |
| 5,173,256 | 12/1992 | Booth et al. | 420/590 |
| 5,184,662 | 2/1993 | Quick et al. | 164/97 |
| 5,288,769 | 2/1994 | Papageorge et al. | 252/511 |

METHODS OF MANUFACTURING COATED PARTICLES HAVING DESIRED VALUES OF INTRINSIC PROPERTIES AND METHODS OF APPLYING THE COATED PARTICLES TO OBJECTS

This is a continuation of application Ser. No. 08/102,532, filed Aug. 4, 1993, now abandoned, which is a continuation of application Ser. No. 07/731,809, filed Jul. 17, 1991, now abandoned.

BACKGROUND OF THE INVENTION

This invention relates to engineering intrinsic properties of particles, of articles manufactured by consolidation of particles, and of coatings formed from particles, and more particularly concerns the manufacture of articles and coatings engineered to have preselected thermal conductivities and coefficients of thermal expansion that match those of materials to which the articles and coatings are attached.

According to the Lacce "Rule of Mixtures," the intrinsic physical properties (e.g., thermal conductivity, coefficient of thermal expansion) of a heterogeneous article composed of at least two thoroughly mixed materials tend to vary approximately linearly with respect to the ratio of the volume of one of the materials to the volume of another of the materials. For example, a heterogeneous article composed of a 50-50 volumetric mixture of one material that has a low coefficient of thermal expansion and another material that has a high coefficient of thermal expansion can be expected to have a coefficient of thermal expansion that is the average of the coefficients of thermal expansion of the two materials.

In a known method of manufacturing heterogeneous articles, a mixture of two metal powders which have different thermal conductivities and coefficients of thermal expansion, is compacted and sintered to produce the article. The article has an engineered coefficient of thermal expansion that approximately matches the coefficient of thermal expansion of an object to which the article is designed to be attached, and an engineered thermal conductivity.

SUMMARY OF THE INVENTION

In one aspect, the invention features coating a particle made from a first material with a second material so that the ratio of the volume of the coating relative to the volume of the particle is substantially equal to a selected volume fraction. The first and second materials and the volume fraction are selected to cause the coated particle to exhibit at least one selected intrinsic property that is a function of intrinsic properties of the first and second materials. The first material is, for example, tungsten, molybdenum, graphite, silicon carbide, or diamond. The second material is, for example, copper.

Through this process a coated particle is manufactured that has one or more engineered intrinsic properties (such as thermal conductivity or coefficient of thermal expansion) that are different from the intrinsic properties of the first and second materials.

In another aspect, the invention features manufacturing an article from the coated particles. A plurality of the coated particles (possibly mixed with other particles) are consolidated to cause all of the particles to be joined to each other to form an article. The article as a whole has a selected volume fraction according to the volumes of the second material in the coated particles relative to the volumes of the first material in the coated particles.

Preferred embodiments include the following features. The first material, the second material, and the volume fraction are selected to engineer the article to exhibit a selected intrinsic property that is a function of intrinsic properties of the first and second materials. In particular, the engineered intrinsic properties of the coated particles are exhibited with a high degree of uniformity and isotropy throughout the article, because each particle is uniformly coated and because there is no inherent randomness of distribution of the different materials or segregation between the different materials within the article.

In one embodiment, the article is engineered to have a coefficient of thermal expansion that substantially matches that of an object to which the article is to be attached. The article is also engineered to have a desired thermal conductivity. The coated particles are consolidated by compaction and solid-state or liquid-phase sintering. Sintering causes the second material to form bonds between adjacent particles.

In another aspect the invention features manufacturing an article from a plurality of particles that include a first material, and from a matrix material that includes a second material that is reactive with the first material. A pre-coat is formed on the surfaces of the particles. The particles and the matrix material are consolidated, to cause the particles and the matrix material to be joined to each other in an article. The pre-coat on the surfaces of the particles impedes the first and second materials from reacting with each other.

In another aspect, the invention features plating of an object with a layer of coated particles. The coated particles are placed in a liquid, and the object is plated with a coating that includes the plurality of particles that were placed in the liquid. The coating has a selected volume fraction according to the volume of the second material in each coated particle relative to the volume of the first material.

In another aspect the invention features plating of an object with particles, which include a first material, while plating the object with a second material as well. The particles are placed in the liquid, and the object is plated with a coating that includes the particles and the second material. The coating has a selected volume fraction representing the volume of the second material in the coating relative to the volume of the first material in the coating. The first material, the second material, and the volume fraction are selected in a manner such that the coating exhibits at least one selected physical property, e.g., thermal conductivity or coefficient of thermal expansion (as opposed to mechanical properties, e.g., tensile strength). The selected physical property of the coating is a function of physical properties of both the first and second materials.

In another aspect, the invention features manufacture of an article by compacting coated particles to a selected density and to a selected shape. The compacted particles are joined to each other to form an article, without increasing the density of the compacted particles and without substantially changing the selected shape of the article. That is, the particles are compacted to approximately "full density" (a density at which the compacted particles have a porosity that does not provide interconnected passages passing from one side of the article to another). Then, the compacted article is sintered. Because the article is fully dense, sintering does not increase the density of the article or change its shape. The density of the article, and thus the final dimensions of the article, can be carefully controlled during compaction.

In another aspect, the invention features manufacture of an article from particles in a manner controlled to cause the article to have a selected density. The particles, at least some of which include a first material and have surfaces on which a coating that includes a second material is formed, are consolidated to cause them to be joined to each other to form the article of the selected density. The first and second materials are selected so that the article exhibits a selected intrinsic property, and the density is selected so that the intrinsic property exhibits engineered behavior as a function of temperature. For example, the degree of linearity of the coefficient of thermal expansion of an article formed from consolidated particles depends on the density of the article. By selecting and controlling the density of the article, the behavior of the coefficient of thermal expansion as a function of temperature is controlled, and, in general, the selection of the coefficient of thermal expansion is further refined.

In another aspect, the invention features manufacture of an article from particles, the article having two or more portions which have different intrinsic properties. A first plurality of particles includes at least one material, and a second plurality of particles includes at least one other material. The first plurality of particles and the second plurality of particles are consolidated to join the first plurality of particles to each other to form a first portion (e.g., a layer) of an article, and the second plurality of particles are joined together to form a second portion of the article; the particles disposed near the interface between the first and second portions of the article are joined together. The first and second portions of the article exhibit different selected intrinsic properties according to the compositions (and volume fractions) of the particles.

For example, the first and second portions may have different coefficients of thermal expansion, and the article may be connected directly between two objects having different coefficients of thermal expansion that match the coefficients of thermal expansion of the two portions. There is only one boundary (located at the interface between the two portions of the article) at which there is mismatch of coefficients of thermal expansion, rather than a series of such boundaries located between consecutive layers of dissimilar articles. The bonds between the particles tend to absorb the stress of thermal expansion, and consequently cracking or delamination at the junction between the two portions is avoided.

Numerous other features, objects, and advantages of the invention will become apparent from the following detailed description and from the claims.

DETAILED DESCRIPTION

Brief Description of the Drawings FIG. 1 shows a cross-section of a coated particle in accordance with the invention.

MANUFACTURE AND STRUCTURE

Figure 1:
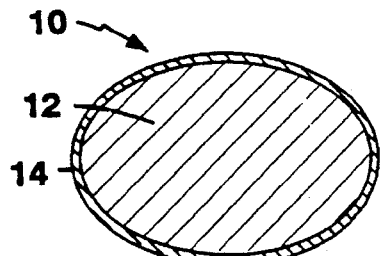

With reference to the drawings, and more particularly FIG. 1 thereof, particle 12, which may be as small as a few microns in diameter, and which includes an elemental metal, a metal alloy, or a non-metal, is covered with a coating 14 of an elemental metal, metal alloy, or non-metal to form coated particle 10. Coated particle 10 exhibits engineered intrinsic physical properties (e.g., thermal conductivity or coefficient of thermal expansion) and/or intrinsic mechanical properties (e.g., tensile strength). The intrinsic physical properties (but not the intrinsic mechanical properties) of coated particle 10 tend to behave in accordance with the Lacce Rule of Mixtures, according to which the intrinsic physical properties vary approximately linearly with respect to the ratio of the volume of coating 14 to the volume of particle 12. Mechanical properties may vary non-linearly with the ratio of volume of coating 14 to the volume of particle 12.

Coating 14 is adherently applied to particle 12 by, e.g., electroless deposition (a technique discussed below). The intrinsic properties of coated particle 10 are engineered by controlling the volume fraction of coating 14 relative to particle 12, which can be accomplished in two ways: 1) by controlling the size of particle 12, or 2) by controlling the thickness of coating 14.

Particle 12 includes, for example, elemental tungsten, coating 14 includes elemental copper, and the volume fraction of copper to tungsten is 27%-to-73%. Copper has a high thermal conductivity of approximately 391 w/m deg.k. (watts per meter-degree kelvin) and a relatively high coefficient of thermal expansion of approximately 17.5 ppm/deg.c. (parts per million per degree centigrade) through the temperature range of 25° C. to 400° C., whereas tungsten has a relatively low thermal conductivity of approximately 164 w/m deg.k. and a relatively low coefficient of thermal expansion of approximately 4.5 ppm/deg.c through the range of 25° C. to 400° C. Copper-coated tungsten particle 10 has a thermal conductivity of approximately 226 w/m deg.k at 25° C. (intermediate between the high thermal conductivity of copper and the lower thermal conductivity of tungsten) and an engineered coefficient of thermal expansion of approximately 8.2 ppm/deg.c. (intermediate between the low coefficient of thermal expansion of tungsten and the higher coefficient of thermal expansion of copper) through the range of 25° C. to 400° C.

Figure 2:
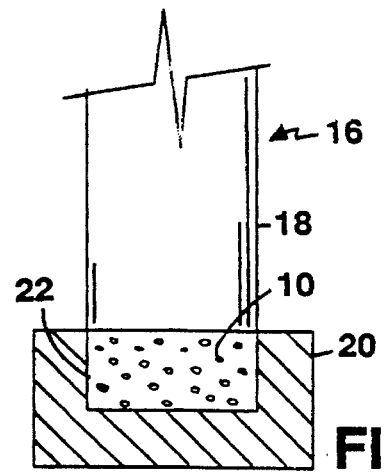
FIG. 2 illustrates consolidating coated particles of FIG. 1 by compaction.

With reference to FIG. 2, there is shown a die-press device 16, including punch 18 and mold 20, which is used to consolidate coated particles 10 into an article 22 by compaction (coated particles 10 having engineered properties as described in connection with FIG. 1). Compacted article 22 is solid-state sintered (sintered at a temperature below the melting point of the particles and the melting point of the coatings of the particles) or alternatively is liquid-phase sintered (sintered at a temperature above the melting point of the coatings but below the melting point of the particles). The sintering causes bonds to form between the particles to provide a heterogeneous article. The coating of the particles thus serves as a "matrix material" (a material that holds the particles together, forming the article).

Article 22 has engineered intrinsic physical properties (e.g., thermal conductivity and/or coefficient of thermal expansion) and/or intrinsic mechanical properties (e.g., tensile strength) that match those of coated particles 10 from which the article is manufactured. The engineered intrinsic properties of coated particles 10 are exhibited with a high degree of uniformity and isotropy throughout article 22, because each particle 10 is uniformly coated and because there is no inherent randomness of distribution of the differing materials or segregation between the differing materials within article 22. Thus, the intrinsic properties of article 22 are engineered at the "particle level" rather than at the "article level." Article 22 is, for example, a thermal and structural plane for electronic packaging, the thermal and structural plane being engineered to have a coefficient of thermal expansion that matches that of an object to which it is attached and engineered to have high thermal conductivity, as described in connection with FIG. 4 below.

Copper-coated tungsten particles, for example, having a volume fraction of copper to tungsten of 27%-to-73%, are compacted in press 16 at 200 tons per square inch of surface area to achieve full density (above approximately 90% density) and the compacted coated particles are solid-state sintered in a hydrogen atmosphere at 1,950 degrees Fahrenheit for approximately one-half hour.

Figure 3:
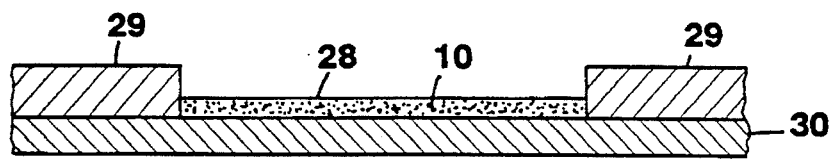
FIG. 3 shows a layer of coated particles of FIG. 1 plated onto a surface of an article.

Not only can coated particles 10 be consolidated into an article as described above, but the coated particles can also be plated onto objects as a coating. With reference to FIG. 3, there is shown a coating 28 of coated particles 10 having engineered properties. Coating 28 is plated onto a surface of a metal, metal alloy, or non-metal article 30 through plating mask 29. Article 30 may alternatively be an article that is itself formed from coated particles by any of the techniques discussed herein. During plating, coated particles, e.g., copper-coated tungsten particles having a volume fraction of copper to tungsten of 27%-to-73%, are placed in a liquid and the coating is formed on an article of, e.g., beryllia by means of one of the plating techniques discussed in detail below. Thus, it possible to create a coating directly on an article without the need to apply a bond between the coating and the article.

Coating 28 has engineered intrinsic physical properties (e.g., thermal conductivity, coefficient of thermal expansion) and/or intrinsic mechanical properties (e.g., tensile strength) that match those of the coated particles from which the coating is manufactured. The engineered intrinsic properties of the coated particles are exhibited with a high degree of uniformity and isotropy throughout coating 28, because each particle is uniformly coated and because there is no inherent randomness of distribution of the differing materials or segregation between the differing materials within coating 28. Thus, the intrinsic properties of coating 28 are engineered at the "particle level" rather than at the "coating level." Note, however, that the plating technique described above can also be implemented where coating 28 does not include coated particles but instead consists of a mixture of different particles selected from two different materials in an appropriate volume fraction.

Figure 4:
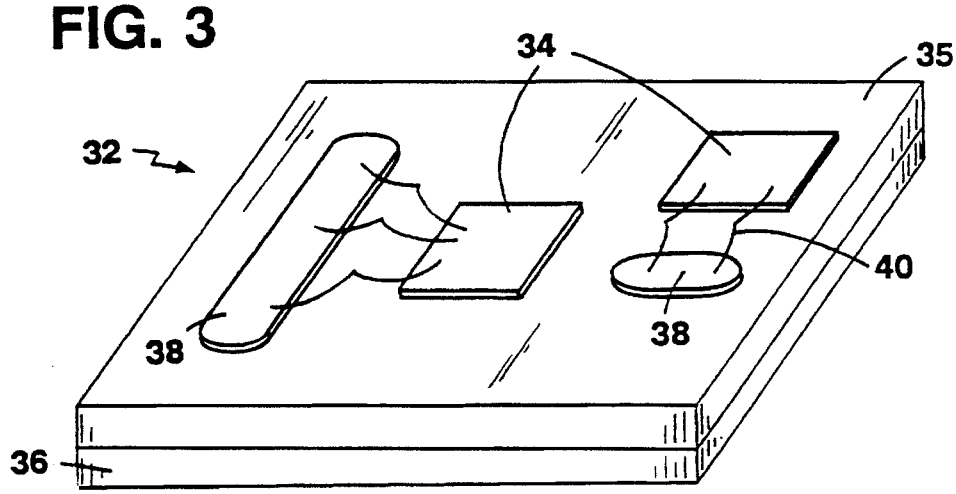
FIG. 4 illustrates electronic packaging that includes a combination structural, thermal, and ground plane manufactured from coated particles of FIG. 1, and lead frames manufactured from coated particles of FIG. 1.

With reference to FIG. 4, there is shown electronic packaging 32 that includes semiconductor devices 34 mounted on a substrate 35, substrate 35 in turn being supported by a combination structural, thermal, and ground plane 36 formed from coated particles. Semiconductor devices 34 are, e.g., high-power solid-state switch devices (such as may be included in the circuitry of an electric motor vehicle), and produce substantial quantities of heat during operation. Substrate 35, to which semiconductor devices 34 are attached by means of an adhesive bond, a diffusion bond, hard or soft solder, or brazing, is formed from a material selected to have a coefficient of thermal expansion approximately matching that of semiconductor devices 34, as is known in the art, in order to facilitate the attachment of semiconductor devices 34 to substrate 35. Structural plane 36 is manufactured in accordance with the present invention from coated particles. The particle material, the coating material, and the volume fraction of the coating material relative to the particle material are selected so that structural plane 36 has high thermal conductivity (to enable it to function as a heat spreader and thermal plane), and yet has a coefficient of thermal expansion substantially matching the coefficient of thermal expansion of substrate 35. Both the thermal conductivity and the coefficient of thermal expansion are highly uniform and isotropic throughout structural plane 36.

Substrate 35 is formed, e.g., of aluminum nitride having a coefficient of thermal expansion of approximately 4.4 ppm/deg.c through the range of 25° C. to 400° C. Structural plane 36 is made from copper-coated graphite particles having a volume fraction of copper to graphite of 24%-to-76%. This volume fraction provides a thermal conductivity of approximately 325 w/m deg.k., and a coefficient of thermal expansion of approximately 4.3 ppm/deg.c. (25° C. to 400° C.), which closely matches that of aluminum nitride substrate 35. The copper matrix material provides high tensile strength (an intrinsic mechanical property) in structural plane 36. Alternatively, structural plane 36 is made from copper-coated diamond particles having a volume fraction of copper to diamond of 20%-to-80%. This volume fraction provides a thermal conductivity of approximately 781 w/m deg.k., and a coefficient of thermal expansion of approximately 4.8 ppm/deg.c (25° C. to 400° C.).

Alternatively, substrate 35 is formed of beryllium oxide (BeO) having a coefficient of thermal expansion of approximately 7.6 ppm/deg.c (25° C. to 400° C.). Structural plane 36 is made from copper-coated graphite particles having a volume fraction of copper to graphite of 42%-to-58%. This volume provides a thermal conductivity of approximately 380 w/m deg.k. and a coefficient of thermal expansion of approximately 7.6 ppm/deg.c. (25° C. to 400° C.), which closely matches that of beryllium oxide substrate 35. Alternatively, structural plane 36 is made from copper-coated diamond particles having a volume fraction of copper to diamond of 37%-to-63%. This volume fraction provides a thermal conductivity of approximately 698 w/m deg.k. and a coefficient of thermal expansion of approximately 7.6 ppm/deg.c (25° C. to 400° C.). Alternatively, structural ground plane 36 is made from copper-coated tungsten particles having a volume fraction of copper to tungsten of approximately 27%-to-73%. This volume fraction provides a thermal conductivity of approximately 226 w/m deg.k. and a coefficient of thermal expansion of approximately 8.2 ppm/deg.c. (25° C. to 400° C.)

Structural plane 36 is attached to substrate 35 in the following manner. A thin layer of coated particles is first co-deposited on the lower surface of substrate 35 as shown in FIG. 3, in accordance with techniques described below. Then structural plane 36, which is compacted (such as in the manner discussed above with reference to FIG. 2) but not yet sintered, is placed in contact with the plated surface of substrate 35. The structure is then sintered to cause substrate 35 and structural plane 36 to unite together into a single structure. Alternatively, structural plane 36 is bonded to plated substrate 35 by brazing, hard or soft soldering, diffusion, or adhesive bonding.

Lead frames 38, to which semiconductor devices 34 are attached by means of wire bonds 40 that carry power, ground, input, and output signals to and from semiconductor devices 34, are also manufactured from coated particles in accordance with the present invention to have a coefficient of thermal expansion substantially matching the coefficient of thermal expansion of substrate 35. Substrate 35 is formed, e.g., of beryllium oxide (BeO) having a coefficient of thermal expansion of approximately 7.6 ppm/deg.c. (25° C. to 400° C.), and lead frames 38 are manufactured from copper-coated nickel 42 particles (nickel 42 being a nickel-iron alloy) having a volume fraction of copper to nickel 42 of 20%-to-80%, a thermal conductivity of approximately 86.78 w/m deg.k., and a coefficient of thermal expansion of approximately 8.1 ppm/deg.c (25° C. to 400° C.). Note that the copper-coated nickel 42 need not have as high a thermal conductivity as the copper-coated graphite used in structural plane 36 because lead frames 38 are not designed to perform a heat spreading function. Alternatively, however, lead frames 38 may be manufactured from the same types of coated particles from which structural plane 36 is manufactured. Lead frames 38 are plated, through a plating mask, directly onto the upper surface of substrate 35, in accordance with techniques described above in connection with FIG. 3. In one embodiment lead frames 38 are sintered to cause the lead frames to reach a desired density.

Even given the high power levels, thermal densities, and operating frequencies that are characteristic of new power electronics technologies, and the large and rapid changes in temperature that consequently typically occur during operation of semiconductor devices 34, cracks and delaminations are not likely to occur at the junctions between substrate 35 and lead frames 38 and between substrate 35 and structural plane 36 because of the substantial matching of the coefficients of thermal expansion across the junctions and because of the uniformity and isotropy with which the thermal conductivity and coefficients of thermal expansion are exhibited throughout structural plane 36 and throughout lead frames 38. The overall packaging structure 32 consequently has a long life.

Not only are the engineered intrinsic properties of articles manufactured in accordance with the techniques described above a function of the materials selected for the particles and the coatings of the particles and a function of the volume fraction of coating material relative to the material out of which the particles themselves are formed, but additionally, the behavior of the intrinsic properties of such articles as a function of temperature (e.g., the degree of linearity of the coefficient of thermal expansion as a function of temperature) are affected by the densities of the articles. Thus, by controlling the density of such an article, the behavior of the coefficient of thermal expansion of the article as a function of temperature can be made to approximate the coefficient of thermal expansion of a ceramic (which behaves non-linearly with respect to temperature) within critical process temperature ranges.

Figure 5:
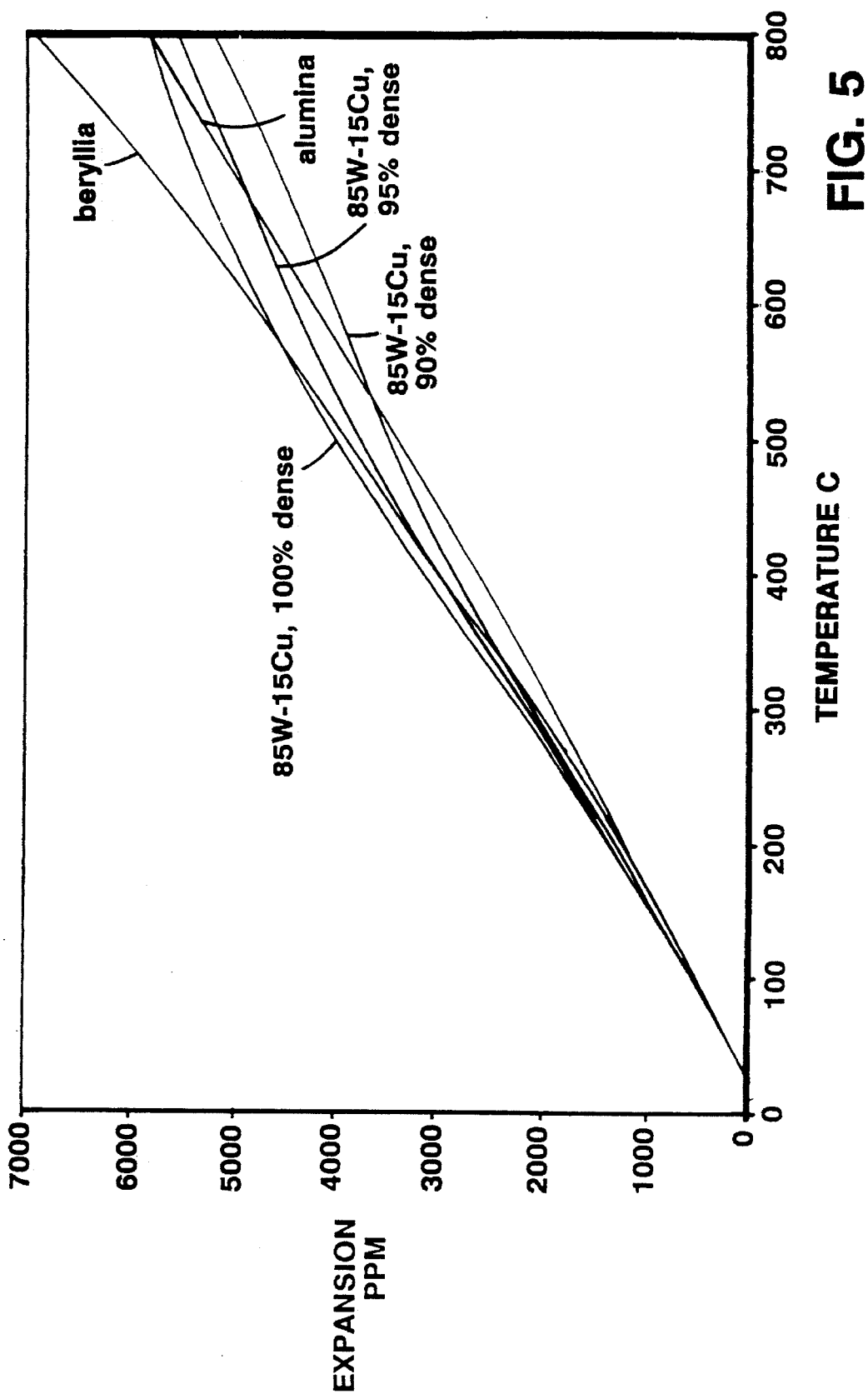
FIG. 5 is a graph illustrating expansion of an article as a function of temperature at densities of 90%, 95%, and 100%.

FIG. 5 illustrates projected thermal expansion, in parts per million as a function of temperature, for articles formed from copper-coated tungsten particles having a volume fraction of copper to tungsten of 27%-to-73% (15% copper to 85% tungsten by weight) at densities of approximately 100% (theoretical density), 95%, and 90%, and for two ceramic materials (BeO and $Al_2O_3$) with which the expansion behavior of the article can be approximately matched within critical process temperature ranges by selecting the appropriate density. Note that the extent to which the article expands (i.e., the value of the coefficient of thermal expansion) decreases with decreasing density. The behavior of the coefficient of thermal expansion (or the behavior of other properties such as thermal conductivity) as a function of temperature can thus be selected, and in general physical properties can thus be further refined, by selecting the density at which the article is manufactured. Note that properties of articles manufactured from non-coated particles can also be controlled by selecting the densities at which the articles are manufactured.

Coating Methods

We first address methods of coating the particles themselves. Then we address methods of plating articles with coatings of coated particles.

Referring to FIG. 1, coating 14 is plated onto particle 12 through the use of any suitable electroless (autocatalytic) plating process. The particles to be coated are placed in an electroless bath that includes an aqueous solution of metal ions, one or more chemical reducing agents, a catalyst, one or more complexing agents, and one or more bath stabilizers. The metal ions are autocatalytically or chemically reduced to metal by the reducing agent or agents, the reducing agent or agents acting as electron donors and the metal ions acting as electron acceptors. The catalyst accelerates the electroless reaction. The complexing agent or agents are used to control the pH of the solution and to control the amount of "free" metal ions available to the solution. The stabilizers function as catalytic inhibitors to retard potential spontaneous decomposition of the bath. In one embodiment, for example, the particles to be plated are graphite, diamond, or silicon carbide particles, copper ions are provided by aqueous copper sulfate, the reducing agent is formaldehyde, the catalyst is palladium, the complexing agent is one or more of: rochelle salt, EDTA ethylene-diamine-tetra-acetate, ammonium hydroxide, pyridium-3-sulfonic acid, and/or potassium tartrate, and the stabilizer is one or more of: thiodiglycolic acid, MBT, (2-mercaptobenzothiazole) thiourea, sodium cyanide, and/or vanadium oxide.

Electroless plating creates either a mechanical bond or a chemical bond between coating 14 and particle 12. The bond will typically (but not always) be mechanical if either coating 14 or particle 12 is non-metal and will typically be chemical if both coating 14 and particle 12 are metal.

Alternative methods of coating particles include electrolytic plating, sputtering, and spraying.

Figures 9, 10:
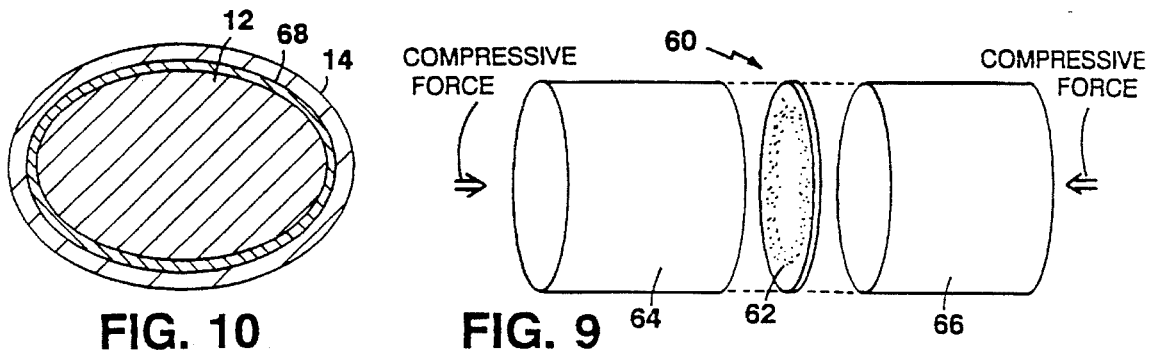
FIG. 9 shows a high-power semiconductor compression module that includes a semiconductor device that is compression interfaced with a heatspreader formed from coated particles of FIG. 1.
FIG. 10 shows a cross-section of a coated particle in accordance with the invention, the particle having a thin interfacial pre-coat.

With reference to FIG. 10, in some embodiments, in which coating 14 would form only a mechanical bond with particle 12 if coating 14 were electroless-plated directly onto particle 12, particle 12 is pre-coated with an extremely thin strike 68 (thickness exaggerated in the Figures) of a pre-coating material and then plated with coating 14. Pre-coat (an interfacial coating) 68 bonds strongly with particle 12 and coating 14, creating a strong, hard to break, chemically bonded, coated particle 10. For example, if particle 12 is graphite or diamond and coating 14 is copper, coating 14 would form a mechanical bond with the graphite or diamond if coating 14 were plated directly onto the graphite or diamond. Instead, a pre-coat 68 of a metal such as chromium or a cobalt-tungsten alloy, having a thickness in the range of about 200 to several thousand angstroms, is first plated onto particle 12, pre-coat 68 forming a cohesive compound with particle 12 at the interface between pre-coat 68 and particle 12. Then coating 14 is plated onto chromium or cobalt-tungsten pre-coat 68, pre-coat 68 forming a metallurgical bond with coating 14. The pre-coat does not substantially affect the thermal conductivity or the coefficient of thermal expansion of coated particle 10 because the pre-coat is extremely thin. In one embodiment a small, controlled amount of a palladium or boron catalyst is co-deposited with cobalt-tungsten pre-coat material, the catalyst serving to accelerate the electroless reaction by which a copper coating 14 is plated onto cobalt-tungsten pre-coat 68.

A pre-coat is also used where coating 14 is reactive with, corrosive of, or otherwise destructive of particle 12, or vice versa. For example, if particle 12 is graphite or diamond and coating 14 is aluminum, the highly reactive aluminum would dissolve the graphite or diamond if coating 14 were plated directly onto particle 12. Instead, a thin strike 68 of a metal such as chromium or cobalt-tungsten is first plated onto particle 12, and then coating 14 is deposited onto pre-coat 68 to form coated particle 10. Pre-coat 68 forms a cohesive bond with graphite or diamond particle 12, thereby protecting particle 12 from the aluminum matrix material. Thus, pre-coat 68 makes it possible to fabricate articles from coated particles where the particles and their coatings would otherwise tend to react with each other.

Pre-coat 68 also makes it possible to mix particles coated with a thin strike of the pre-coat (but without coating 14) into a molten alloy, where the particles and the alloy would otherwise tend to react with each other. For example, graphite particles coated with a thin strike of a cobalt-tungsten pre-coat are added to an aluminum alloy in the presence of a vacuum, and the alloy containing the particles is die cast or extruded into a net-shaped (or near net-shaped) article, which in one embodiment is used as a thermal management product for electronics (e.g., a heat spreader and thermal plane). The cobalt-tungsten pre-coat forms a cohesive bond with the graphite particles and forms a metallurgical bond with the aluminum alloy. The volume fraction of particles to the alloy material (the particles constituting up to about 50% by volume) is selected to cause the resulting article to have engineered physical properties such as thermal conductivity or coefficient of thermal expansion. Alternatively, the pre-coated particles are added to the alloy to mechanically strengthen the resulting article or to affect its weight.

We now discuss methods of plating articles with coatings of coated particles. With reference again to FIG. 3, an article 30 is plated with a coating 28 of coated particles 10 (article 30 being, e.g., a substrate upon which coating 28 forms, e.g., a lead frame). If article 30 is a metal or metal alloy, coating 28 is electrolytically plated directly onto article 30 by means of a technique described below. If article 30 is non-conductive (e.g., ceramic), however, article 30 is first plated with a thin coating of conductive material, such as the matrix material with which coated particles 10 are coated, through the use of electroless (autocatalytic) plating (a technique described above in connection with coating of particles). The electroless bath includes an aqueous solution containing metal ions, one or more chemical reducing agents, a catalyst, one or more complexing agents, and one or more bath stabilizers, as described above. The metal ions are autocatalytically or chemically reduced by the reducing agent or agents, which causes the metal to be deposited onto article 30. Alternatively, particles (either non-coated, pre-coated, or coated) are placed in the aqueous solution, and the particles are coated with the metal as the metal-coated particles are simultaneously plated onto article 30. Because electroless plating is slower than electrolytic plating, coated particles 10 are electrolytically plated onto the thin conductive layer (by means of the technique described below) as soon as the thin conductive layer is formed, thereby forming coating 28.

Figure 11:
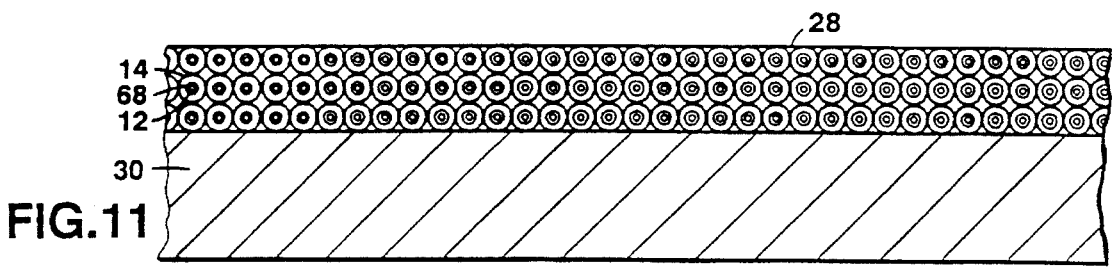
FIG. 11 shows the coated particles of FIG. 10 being electrolytically co-deposited onto an article in conjunction with matrix material.

With reference to FIG. 11, coating 28 is plated onto conductive article 30 (or a non-conductive article metallized with a thin conductive layer as described above) through the use of electrolytic co-deposition of coated particles 10 and matrix material (the material out of which coatings 14 of coated particles 10 are formed) onto article 30. As coated particles 10 (e.g., graphite particles 12 coated with a thin interfacial pre-coat 68 of chromium or cobalt-tungsten upon which copper coating 14 is deposited) are plated onto article 30, matrix material is simultaneously plated around the coated particles to fill the gaps between the coated particles, thereby forming coating 28.

Figure 12:
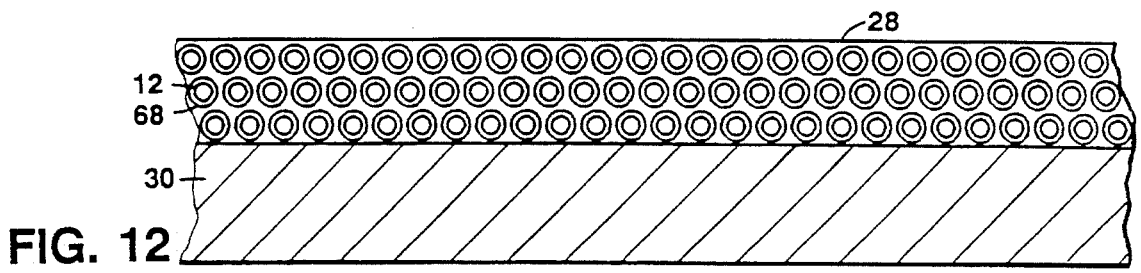
FIG. 12 shows pre-coated particles being electrolytically co-deposited onto an article in conjunction with matrix material.

With reference to FIG. 12, in an alternative electrolytic plating method, matrix material and particles 12 (which are coated with a pre-coat 68 as described above but which are not yet coated with the matrix material) are co-deposited onto article 30. As particles 12 are plated onto article 30 the particles are simultaneously plated with the matrix material to form coating 28. For example, particles 12 are graphite, the matrix material is copper, and the pre-coat material is a metal such as chromium or cobalt-tungsten.

Alternatively, coating 28 is formed on article 30 by sputtering or spraying coated particles 10 onto the article. Coating 28 is then sintered, after which coating 28 exhibits its selected intrinsic property or properties.

Other Embodiments

Other embodiments are within the scope of the claims. For example, there are numerous materials out of which particle 12 and coating 14 (FIG. 1) may be formed. Particles 12 may consist of, e.g., tungsten, molybdenum, graphite, silicon carbide, diamond, nickel 42, KOVAR (an alloy having approximately 0.02% carbon, 0.3% manganese, 0.2% silicon, 29% nickel, 17% cobalt, and the balance iron), or a ceramic, and coating 14 may consist of, e.g., copper or aluminum.

The coating may even be a non-metal (e.g., a glass, oxide, ceramic, resin, polymer, or other organic such as silicone), provided that the coating material is capable of fusing to form bonds between the particles and provided that neither the coating material nor the material out of which the particles are formed melts at a temperature lower than that at which the coated particles are fired to cause the non-metal coatings to fuse together. Particles may be coated with such a non-metal coating by placing the particles in a slurry of the non-metal material and then removing the particles from the slurry, the particles being sized such that when the coated particles are removed from the slurry the coated particles have a selected volume fraction of coating to particle material. The coated particles are then consolidated and/or fired, causing the coatings to vitrify or fuse together.

Graphite and diamond are good materials from which to form particles 12 where the article or coating being manufactured must have a low coefficient of thermal expansion and a high thermal conductivity, because these materials not only have a low coefficient of thermal expansion (as do tungsten and molybdenum) but also have a relatively high thermal conductivity (unlike tungsten and molybdenum). Consequently these materials have the advantage that they do not have the adverse side-effect of reducing thermal conductivity of the coated particles and articles and coatings formed from the coated particles.

Where the article or coating being manufactured must have a coefficient of thermal expansion matching that of a silicon semiconductor or integrated circuit device to which the article or coating is directly attached (silicon having a coefficient of thermal expansion of approximately 4.2 ppm/deg.c.), the article or coating includes, e.g., copper-coated diamond particles having a volume fraction of copper to diamond of approximately 20%-to-80% or copper-coated graphite particles having a volume fraction of copper to graphite of approximately 24%-to-76%.

It is possible to engineer many intrinsic properties other than thermal conductivity or coefficient thermal expansion. For example, the electrical conductivity of an article may be engineered in combination with the engineering of other intrinsic properties. Thus, in one embodiment, the choice between using graphite particles (which are electrically conductive) and diamond particles (which are electrical insulators) is based on the desired electrical conductivity of the article.

With reference to FIG. 2, particles 10 need not consist entirely of coated particles. Alternatively, a mixture of coated particles combined with other particles (e.g., copper-coated tungsten particles can be combined with copper particles) may be thoroughly mixed and then compacted to form an article 22 having intrinsic properties that are a function of the volume fractions of all of the materials in the mixture, article 22 exhibiting the intrinsic properties isotropically. Alternatively, the coated particles are combined with materials that exhibit one or more intrinsic properties anisotropically, causing the article in turn to exhibit one or more intrinsic properties anisotropically. For example, the coated particles are mixed with crystalline materials that have properties that differ in different directions, the crystalline materials being mixed with the coated particles in a manner such that the crystalline materials tend to be oriented in a common direction. In another example, the coated particles are mixed with carbon fibers, the carbon fibers tending to be oriented in a common direction. The carbon fibers provide tensile strength that varies with respect to direction.

Alternative techniques for manufacture of articles from coated particles include metal injection molding, hot isostatic pressing ("hipping"), cold isostatic pressing ("cipping"), hot or cold isostatic forging, hot or cold roll compacting (which "densifies" consolidated coated particles), and die casting.

If coated particles 22 are compacted to a density approximating "full density" (the density at which the compacted coated particles have "level 2" or "level 3" or "non-interconnected" porosity, a porosity that does not provide interconnected passages passing from one side of the article to another), the sintering process does not increase the density or change the shape of the article. The density of the article, and thus the final dimensions of the article, can be carefully controlled during compaction. It is especially practical to compact to full density where the particles include certain non-metals such as graphite, because, e.g., copper-coated graphite particles can be compacted to full density at a relatively low pressure of 60 to 80 tons per square inch. Where the particles are formed from a metal or metal alloy (whether the particles are coated with metal or non-coated), pressures of approximately 80 to 200 tons per square inch are typically required to compact the particles to full density.

Figure 6:
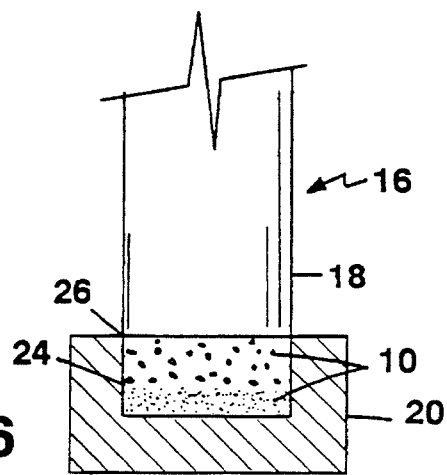
FIG. 6 illustrates consolidating two distinct layers of coated particles of FIG. 1 by compaction.

With reference to FIG. 6, there is shown a die-press device 16, including punch 18 and mold 20, which is used to consolidate two distinct layers 24 and 26 of particles by compaction to provide an article 25 having intrinsic properties that vary from layer to layer. Layers 24 and 26 consist of particles composed of differing materials or having differing volume fractions of the materials from which the particles are formed. The particles are not necessarily coated particles. The particles are introduced into mold 20 in layers 24 and 26, compacted to a selected density chosen to yield temperature-dependent intrinsic properties (e.g., thermal conductivity and coefficient of thermal expansion) as discussed in connection with FIG. 5, and sintered in a hydrogen atmosphere for about one-half hour. The sintering causes the particles of layers 24 and 26 to bond at the interface between the two layers, to yield a single, layered article.

For example, layer 24 includes copper-coated tungsten particles having a volume fraction of copper to tungsten of 27%-to-73% and layer 26 includes elemental copper particles. Layer 24, after compaction, has a thermal conductivity of approximately 225.78 w/m deg.k. and a coefficient of thermal expansion of approximately 8.28 ppm/deg.c. Layer 26, after compaction, has a thermal conductivity of approximately 390 w/m deg.k. and a coefficient of thermal expansion of approximately 18.04 ppm/deg.c. Layered article 25 is connected directly between two objects having different coefficients of thermal expansion that match the coefficients of thermal expansion of layers 24 and 26. For example, layer 24 is attached to a beryllia ceramic and layer 26 is diffusion bonded to a copper heat sink.

Alternatively, layer 24 includes copper-coated diamond having a volume fraction of copper to diamond of 20%-to-80%, and layer 26 consists of copper-coated graphite having a volume fraction of copper to graphite of 24%-to-76%. After compaction, a silicon die is attached to a side of article 25 that corresponds to layer 26, and an aluminum nitride substrate is attached to the other side of article 25, which corresponds to layer 24. Layer 24 has a thermal conductivity of approximately 78 w/m deg.k., and a coefficient of thermal expansion of approximately 4.8 ppm/deg.c. (25° C.–400° C.), which substantially matches the coefficient of thermal expansion of the aluminum nitride substrate. Layer 26 has a thermal conductivity of approximately 379 w/m deg.k., and a coefficient of thermal expansion of approximately 4.3 ppm/deg.c. (25° C.–400° C.), which substantially matches the coefficient of thermal expansion of the silicon die. Layer 24 is alternatively designed to be attached to a beryllium oxide substrate, layer 24 having a volume fraction of copper to diamond of 37%-to-63%, a thermal conductivity of approximately 698 w/m deg.k., and a coefficient of thermal expansion of approximately 7.6 ppm/deg.c. (25° C.–400° C.), which substantially matches the coefficient of thermal expansion of the beryllium oxide substrate.

Thus, layered article 25 is connected directly between two objects having different coefficients of thermal expansion. The boundary between different coefficients of thermal expansion occurs within layered article 25, rather than at one or more interfaces between surfaces of the article and other devices. Moreover, there is only one boundary (located between the two layers inside layered, discrete article 25) at which there is mismatch of coefficients of thermal expansion, rather than a series of such boundaries located between consecutive layers of dissimilar articles. Because the copper bonds between the particles are compliant and malleable, the copper bonds tend to absorb the stress of thermal expansion, and consequently there is no cracking or delamination at the junction between the two layers. Moreover, because the bonds are compliant and because all of the bonds are formed of the same material (all copper-to-copper bonds), the bonds tend to absorb stress equally, and the article consequently does not tend to bow or ripple with large changes in temperature. In an alternative embodiment there are more than two layers within article 25 and consequently there is more than one internal boundary at which there is a mismatch of coefficients of thermal expansion. The mismatch at each boundary is less than the mismatch that occurs when there is a single boundary within layered article 25.

Figure 7:
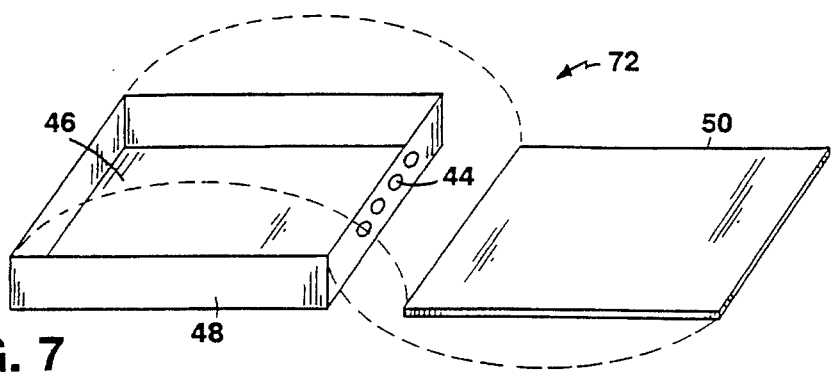
FIG. 7 depicts a hybrid electronics package, used for enclosing integrated circuitry, which is manufactured from coated particles of FIG. 1.

With reference to FIG. 7, there is shown a hybrid electronics package 72, having sides 48, base 46, and lid 50, which is used for housing semiconductor integrated circuits and other electronic devices. Hybrid electronics packages are generally fabricated from a nickel-iron alloy known as KOVAR, which has a coefficient of thermal expansion that is approximately equal to that of the glass insulators used to insulate device feedthroughs 44 from the conductive KOVAR package. The application of the invention to the manufacture of hybrid package 72 is dependent upon whether conventional glass insulation is used to insulate feedthroughs 44 or whether an alternative insulation is used.

If conventional glass insulation is used, then the objective is to manufacture a hybrid package having a coefficient of thermal expansion substantially matching that of KOVAR but having a thermal conductivity higher than that of KOVAR. For example, the hybrid package may be manufactured from iron-coated graphite particles having a volume fraction of iron to graphite of 26%-to-74%, a coefficient of thermal expansion of approximately 3.2 ppm/deg.c. (25° C.–400° C.) substantially matching that of KOVAR, and a thermal conductivity of approximately 295 w/m deg.k., which is much higher than the thermal conductivity of KOVAR (approximately 11 w/m deg.k.).

If a low-temperature glass ceramic is substituted for glass as insulation for feedthroughs 44, then hybrid package 72 is manufactured from, e.g., copper-coated graphite particles having a volume fraction of copper to graphite of 39%-to-61%. This volume fraction provides a high thermal conductivity of approximately 379 w/m deg.k., and a coefficient of thermal expansion of approximately 6.9 ppm/deg.c. (25° C.–400° C.), which is engineered to match substantially the coefficient of thermal expansion of the glass ceramic material used to insulate feedthroughs 72.

The coefficient of thermal expansion is highly uniform throughout hybrid electronics package 72. Because base 46 and sides 48 of hybrid electronics package 72 can be net-shaped fabricated together as a single piece (whereas with a KOVAR package, base 46 and sides 48 are typically separately machined from solid chunks of the KOVAR material), package 72 can be manufactured without the cost of machining or brazing base 46 and sides 48 together, although lid 50 must be attached to sides 48 by brazing after the integrated circuitry has been placed inside the package.

Figure 8:
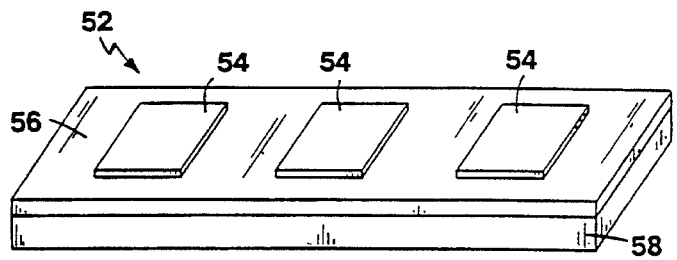
FIG. 8 shows an electronics package having a low-temperature ceramic substrate that is fired while supported by a pre-sintered combination structural, thermal, and ground plane manufactured from coated particles of FIG. 1.

With reference to FIG. 8, there is shown an electronics package 52 having a set of integrated circuits 54 mounted on a low-temperature glass ceramic substrate 56 supported by a combination structural, thermal, and ground plane 58. Structural plane 58 is manufactured from copper-coated graphite particles having a volume fraction of copper to graphite of 39%-to-61%. This volume fraction provides a high thermal conductivity of approximately 379 w/m deg.k., high tensile strength, and a coefficient of thermal expansion of approximately 6.9 ppm/deg.c. (25° C.–400° C.), which substantially matches the coefficient of thermal expansion of ceramic substrate 56. The coefficient of thermal expansion is highly uniform and isotropic throughout structural plane 58. The copper-coated graphite particles from which structural plane 58 is manufactured are compacted to a density selected to cause the expansion behavior of structural plane 58 to match substantially the nonlinear expansion behavior of ceramic substrate 56. Then the coated particles are sintered. A "green form" ceramic substrate 56 (a ceramic substrate that has not yet been fired) is then layered onto structural plane 58, after which "green form" ceramic substrate 56 is fired. Ceramic substrate 56 has a firing temperature below the temperature at which structural plane 58 is solid-state sintered. Consequently, when ceramic substrate 56 is fired while mounted on structural plane 58, the coatings of the particles in the structural plane do not melt. Presintered structural plane 58 provides high manufacturing yields by providing a structural platform on which to handle thin, fragile layers of ceramic and/or glass throughout the processing cycle without breakage.

With reference to FIG. 9, there is shown a high-power semiconductor compression module 60 that includes silicon semiconductor device 62, e.g., a silicon switch approximately the size of a half dollar or silver dollar and having a coefficient of thermal expansion of approximately 4.3. Semiconductor device 62 is compression interfaced at approximately 5000 pounds with a heatspreader 64 formed from copper-coated graphite particles in accordance with the invention. Semiconductor device 62 has a molybdenum back surface, having a low coefficient of thermal expansion, that backs to an aluminum heatspreader 66 (which is not manufactured from particles). Heatspreader 64, having a volume fraction of copper to graphite of 24%-to-76%, is engineered to have a high thermal conductivity of 379 w/m deg.k. and a coefficient of thermal expansion of 4.3 ppm/deg.c. (25° C.–400° C.), which substantially matches the coefficient of thermal expansion of semiconductor device 62, the coefficient of thermal expansion being highly uniform throughout heatspreader 64. The engineering of the coefficient of thermal expansion of heatspreader 64 prolongs the life of semiconductor device 62 by preventing scoring of semiconductor device 62 by compression interfaced heatspreader 64, which can create a short circuit.

There have been described novel and improved apparatus and techniques for engineering of intrinsic properties of articles manufactured by consolidation of particles. It is evident that those skilled in the art may now make numerous uses and modifications of and departures from the specific embodiments described herein without departing from the inventive concept. For example, the principles of the invention can be applied to other fields, such as firearms and weaponry, to ensure that the casings of shells and projectiles have the same coefficient of thermal expansion as the barrels from which they are fired, which may be lined with ceramic material. Consequently, the invention is to be construed as embracing each and every novel feature and novel combination of features present in or possessed by the apparatus and technique herein disclosed and limited solely by the spirit and scope of the appended claims.

We claim:

1. A method of imparting to particles that have a first value of an intrinsic property and that are to have a coating applied thereon a desired value of said intrinsic property that differs from said first value, comprising the steps of:

providing said particles in a state in which said particles are unattached to each other;

providing material for said coating, said material having a second value of said intrinsic property that differs from said first value such that when said material is applied as said coating on said particles the value of said intrinsic property of the coated particles will be a function of said first value and said second value according to a volume of said coating relative to a volume of said particles;

determining the volume of said coating relative to the volume of each of said particles that will make said value of said intrinsic property of each of said coated particles equal to said desired value; and applying said coating on each of said particles in approximately the determined volume, said particles being unattached to each other while said coating is at least initially applied.

2. A method in accordance with claim 1, wherein said second material comprises a metal or a metal alloy.

3. A method in accordance with claim 1, wherein said second material comprises a non-metal.

4. A method in accordance with claim 2, wherein said second material comprises copper.

5. A method in accordance with claim 2, wherein said second material comprises aluminum.

6. A method in accordance with claim 1, wherein said first material comprises tungsten.

7. A method in accordance with claim 1, wherein said first material comprises molybdenum.

8. A method in accordance with claim 1, wherein said first material comprises graphite.

9. A method in accordance with claim 1, wherein said first material comprises silicon carbide.

10. A method in accordance with claim 1, wherein said first material comprises diamond.

11. A method in accordance with claim 1, wherein said first material comprises nickel 42.

12. A method in accordance with claim 1, wherein said first material comprises KOVAR.

13. A method in accordance with claim 1, wherein said first material comprises a ceramic.

14. A method in accordance with claim 1 wherein each of said particles consists of an uncoated material before said step of applying said coating on said particles, and said uncoated material has said first value of said intrinsic property.

15. A method of coating an object with a coating comprising a plurality of particles and imparting to said coating a desired value of an intrinsic property, comprising the steps of:

providing said plurality of particles in a state in which said particles are unattached to each other, said particles being comprised of a first material and having a first value of said intrinsic property, and providing a second material to be applied to an outer surface of each of said particles, said second material having a second value of said intrinsic property differing from said first value;

determining the volume of said second material to be applied to said outer surface of each of said particles relative to the volume of each of said particles that will impart to each of said particles a value of said intrinsic property that is approximately the same for each particle and that will result in said coating having a value of said intrinsic property equal to said desired value, said value of said intrinsic property of said coating being a function of said first value and said second value according to a volume of said second material in said coating relative to a volume of said particles in said coating;

applying said second material to said outer surface of each of said particles in approximately the determined volume, said particles being unattached to each other while said second material is at least initially applied; and forming on said object said coating, by providing a liquid, providing said plurality of particles which comprise said first material and have said second material applied thereon, placing said plurality of particles in said liquid, and then consolidating from said liquid said plurality of particles and a matrix material to form said coating on said object.

16. A method in accordance with claim 14, wherein said second material comprises a metal or metal alloy.

17. A method in accordance with claim 15, wherein said object comprises a substrate means for supporting at least one circuit, and said intrinsic property is a coefficient of thermal expansion selected to approximate a coefficient of thermal expansion of said substrate.

18. A method in accordance with claim 17, wherein said coating forms a lead frame, on said substrate, configured for electrical connection to said at least one circuit.

19. A method in accordance with claim 17, wherein said substrate comprises beryllium oxide.

20. A method in accordance with claim 17, wherein said substrate comprises aluminum nitride.

21. A method in accordance with claim 17, wherein said substrate comprises alumina.

22. A method in accordance with claim 15 wherein said first material in each of said particles is uncoated before said step of applying said coating on said particles, and said first material has said first value of said intrinsic property.

23. A method in accordance with claim 15 wherein said matrix material comprises said second material.

24. A method in accordance with claim 15 wherein said step of consolidating from said liquid said plurality of particles and said matrix material to form said coating comprises electrolytic co-deposition of said particles and said matrix material.

25. A method in accordance with claim 15 wherein said plurality of particles comprises all of the particles placed in said liquid.

26. A method of coating an object with a coating comprising a plurality of particles and a matrix material and imparting to said coating a desired value of an intrinsic physical property, comprising the steps of:

providing said plurality of particles in a state in which said particles are unattached to each other, said particles being comprised of a first material and having a first value of said intrinsic physical property, and providing a second material to be applied to an outer surface of each of said particles, said second material having a second value of said intrinsic property differing from said first value;

providing said matrix material, said matrix material being comprised of said second material;

determining the volume of said second material to be applied to said outer surface of each of said particles relative to the volume of each of said particles that will impart to each of said particles a value of said intrinsic property that is approximately the same for each particle and that will result in said coating having a value of said intrinsic physical property equal to said desired value, the value of said intrinsic property of said coating being a function of said first value and said second value according to a volume of said second material in said coating relative to a volume of said particles in said coating;

applying said second material to said outer surface of each of said particles in approximately the determined volume, said particles being unattached to each other while said second material is at least initially applied; and forming on said object said coating, by providing a liquid, providing said plurality of particles, placing said plurality of particles in said liquid, and forming said coating on said object by consolidating from said liquid said plurality of particles and said matrix material to form said coating.

27. A method in accordance with claim 26, wherein said intrinsic physical property is a coefficient of thermal expansion.

28. A method in accordance with claim 26, wherein said intrinsic physical property is a thermal conductivity.

29. A method in accordance with claim 26 wherein said first material in each of said particles is uncoated before said step of applying said coating on said particles, and said first material has said first value of said intrinsic property.

30. A method in accordance with claim 26 wherein said step of applying said second material to an outer surface of each of said particles is performed prior to said step of forming said coating on said object by consolidating from said liquid said plurality of particles and said matrix material to form said coating.

31. A method in accordance with claim 30 wherein said step of applying said second material to an outer surface of each of said particles is performed prior to said step of placing said plurality of particles in said liquid.

* * * * *